United States Patent
Arcudia et al.

(10) Patent No.: US 9,484,867 B2
(45) Date of Patent: Nov. 1, 2016

(54) WIDEBAND LOW-POWER AMPLIFIER

(71) Applicant: QUALCOMM Incorporated, San Diego, CA (US)

(72) Inventors: Kenneth Luis Arcudia, Cary, NC (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 110 days.

(21) Appl. No.: 14/335,421

(22) Filed: Jul. 18, 2014

(65) Prior Publication Data

US 2016/0020740 A1    Jan. 21, 2016

(51) Int. Cl.
*H03F 3/45*    (2006.01)
*H03F 1/32*    (2006.01)
*H03F 1/42*    (2006.01)

(52) U.S. Cl.
CPC .............. *H03F 1/3211* (2013.01); *H03F 1/42* (2013.01); *H03F 3/45197* (2013.01); *H03F 3/45654* (2013.01); *H03F 2203/45332* (2013.01); *H03F 2203/45488* (2013.01); *H03F 2203/45494* (2013.01); *H03F 2203/45644* (2013.01); *H03F 2203/45691* (2013.01); *H03F 2203/45726* (2013.01)

(58) Field of Classification Search
CPC ........................................................ H03F 3/45
USPC .................................................. 330/69, 261
See application file for complete search history.

(56) References Cited

U.S. PATENT DOCUMENTS

| | | |
|---|---|---|
| 5,936,563 A | 8/1999 | Nakamura |
| 7,212,627 B2* | 5/2007 | Choksi ..................... 379/390.04 |
| 7,480,347 B2 | 1/2009 | Black et al. |
| 2008/0260049 A1 | 10/2008 | Wood |
| 2012/0068769 A1 | 3/2012 | Wang et al. |
| 2012/0262235 A1* | 10/2012 | Hoogzaad ..................... 330/252 |
| 2013/0207722 A1 | 8/2013 | Bulzacchelli et al. |
| 2014/0077878 A1* | 3/2014 | Hsieh ............................ 330/254 |
| 2014/0146922 A1 | 5/2014 | Nazemi et al. |

FOREIGN PATENT DOCUMENTS

| | | |
|---|---|---|
| EP | 1748552 A1 | 1/2007 |
| WO | WO-2007-048007 A2 | 4/2007 |

OTHER PUBLICATIONS

Hou Z., et al., "A 23-mW 30-Gb/s Digitally Programmable Limiting Amplifier for 100GbE Optical Receivers", 2014 Radio Frequency Integrated Circuits Symposium, IEEE, Jun. 1, 2014, pp. 279-282, XP032615992, ISSN: 1529-2517, DOI: 10.1109/RFIC.2014.6851719, ISBN: 978-1-4799-3862-9 [retrieved on Jul. 9, 2014] p. 279, left-hand column, line 19—p. 282, right-hand column, line 5; figures 1-8.

(Continued)

*Primary Examiner* — Henry Choe
(74) *Attorney, Agent, or Firm* — Haynes and Boone, LLP

(57) ABSTRACT

An amplifier is provided that includes a differential pair of transistors configured to steer a tail current responsive to a differential input voltage. The amplifier also includes a transconductor that tranconducts high-frequency changes in the differential output voltage into a differential bias current conducted through the differential pair of transistors.

27 Claims, 5 Drawing Sheets

(56) References Cited

OTHER PUBLICATIONS

International Search Report and Written Opinion—PCT/US2015/032261—ISA/EPO—Sep. 8, 2015.

Lee H.D., et al., "A CMOS Wideband Linear-in-dB VGA for UWB Applications", Microwave and Optical Technology Letters, vol. 49, No. 4, Apr. 1, 2007, pp. 812-817, XP055209741, ISSN: 0895-2477, DOI: 10.1002/mop.22278 p. 812, right-hand column, line 45—p. 816, left-hand column, line 18; figures 1, 2(a). 2(b), 3, 4, 6.

* cited by examiner though detailed description.

WIDEBAND LOW-POWER AMPLIFIER

TECHNICAL FIELD

This application relates to amplifiers, and more particularly to a wide-band low-power amplifier.

BACKGROUND

Modern microprocessors operate on wide-bit words. For example, it is conventional for some microprocessors to process 64-bit words. As processor clock rates increase ever higher, the routing of such relatively wide-bit words on wide-bit buses becomes problematic. At high transmission speeds, the inevitable skew with regard to propagation on separate traces in the wide-bit buses may lead to unacceptable bit error rates. Moreover, such buses demand a lot of power and are expensive to design.

To enable the high-speed transmission of data words without the skew and distortion issues associated with high-speed wide-bit buses, serializer-deserializer (SERDES) systems have been developed. A SERDES transmitter serializes the data words into a high-speed serial data stream. A SERDES receiver receives the high-speed serial data stream and deserializes it back into the parallel data words. The serial transmission is usually differential and includes an embedded clock. The skew and distortion issues associated with high-speed wide-bit data buses are thus abated.

Although SERDES systems enable very high-speed data transmission such as 10 gigabits per second or even higher rates, the transmission characteristics for the differential serial data channel between the transmitter and receiver are not linear across the corresponding Nyquist bandwidth of 5 Ghz. Instead, the channel has a frequency-dependent response that reduces the amplitude of the higher-frequency portions of the data bandwidth. To counter the resulting distortion, the SERDES receiver includes an amplifier that is not linear across the frequency spectrum but instead emphasizes the higher frequency bands for the received data spectrum.

To provide this frequency-dependent amplification as shown in FIG. 1, a conventional SERDES receiver amplifier may include a first-stage transconductance amplifier stage 105 that drives a second-stage transimpedance amplifier stage 110. Within first stage 105, a differential pair of transistors M1 and M2 are biased by current sources $I_1$ and $I_2$. These current sources in combination create a bias current that is steered between transistors M1 and M2 responsive to a differential input voltage formed from input voltages IN and INX that drive the gates of transistors M1 and M2, respectively. The resulting difference in the currents conducted by transistors M1 and M2 produces a voltage difference at their drains, which are coupled to a power supply through load resistors $R_L$. Transimpedance amplifier 115 in second stage 110 amplifies the differential voltage across the drains of transistors into a differential output voltage formed from output voltages OUT and OUTX. The second-stage 110 includes a negative feedback loop formed by a differential pair of transistors M3 and M4 that are biased by a current source $I_3$. For example, suppose that a drain voltage VM3 for transistor M3 is higher than a drain voltage VM4 for transistor M4. Transimpedance amplifier 115 will then swing output voltage OUTX higher than output voltage OUT. If this change in the drain voltages is relatively low frequency, the high value for output voltage OUTX will pass through a low pass filter (LPF) to turn transistor M3 on. Transistor M3 will then discharge its drain voltage VM3, which reduces the difference between drain voltages VM3 and VM4. In contrast, if the change in the drain voltages was relatively high frequency, drain voltage VM3 would remain higher than drain voltage VM4. The negative feedback through the low pass filters and the differential pair of transistors M3 and M4 thus reduces the gain for second stage amplifier 110 at the lower frequencies. But this reduction of gain required the discharging of the drain voltages VM3 and VM4 and thus increases power consumption. Moreover, the use of two stages for amplification demands a lot of die area.

Accordingly, there is a need in the art for improved amplifiers providing high-frequency emphasis over a wideband width while having greater density and reduced power demands.

SUMMARY

An amplifier is provided with a differential pair of transistors driven by a differential input voltage across their gates to produce a differential output voltage across a pair of output terminals for the differential pair of transistors. A first load resistor and a first transconductor couple to a first one of the output terminals. Similarly, a second load resistor and a second transconductor couple to a remaining second one of the output terminals. The amplifier also includes a high-pass filter that filters the differential output voltage to produce a filtered differential voltage.

The transconductors are biased to each drive a bias current through the corresponding differential pair transistor when the filtered differential voltage is zero. Since each transconductor would then be conducting the same bias current, a differential bias current as defined by the difference between the bias currents would equal zero. As the filtered differential voltage increases from zero, the differential bias current increases from zero. The bandwidth and high-frequency gain for the amplifier is then increased accordingly from this positive feedback through the transconductors. In contrast, a conventional solution to increase bandwidth and gain was to simply replace the load resistors with reduced-resistance load resistors but such an increase comes at increased current loss through the load resistors across all frequencies. The amplifier disclosed herein obtains this increased gain at higher frequencies and the increased bandwidth yet saves power because the load resistors may retain a relatively high resistance to reduce power consumption accordingly. These and other advantageous features may be better appreciated through the following detailed description.

DETAILED DESCRIPTION

Figure 1:
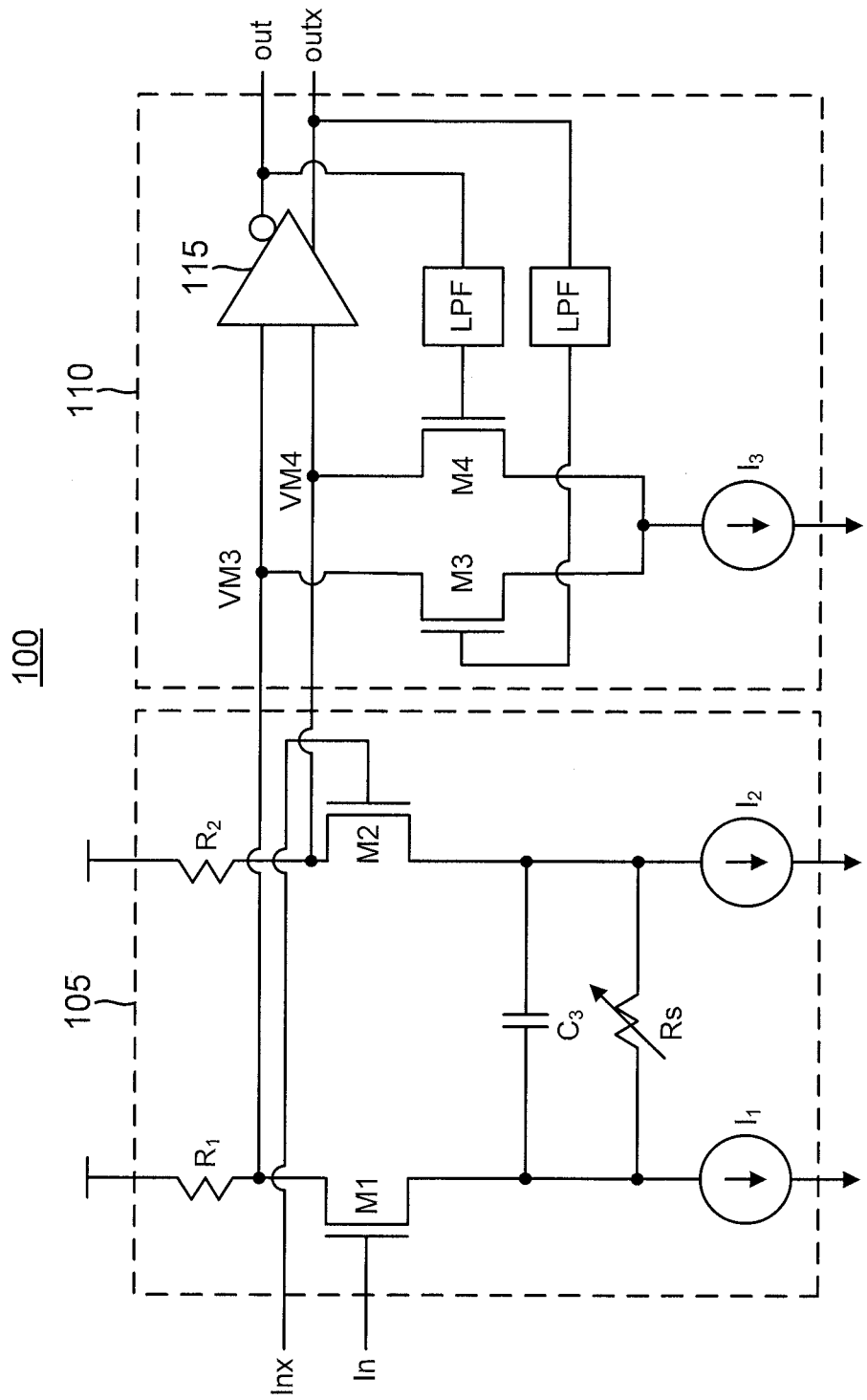
FIG. 1 is a schematic diagram of a prior art amplifier.

A single stage amplifier is provided that includes a differential pair of transistors each having a first terminal coupled to a corresponding load resistor. The gates for the differential pair of transistors form a differential pair of input nodes for the amplifier. The transistors in the differential pair steer a tail current based upon a differential input voltage across their gates. A first transistor in the differential pair has a first terminal coupled to a first load resistor. Similarly, a remaining second transistor in the differential pair has a first terminal coupled to a second load resistor. A second terminal for the first transistor couples to a first current source. Similarly, a second terminal for the second transistor couples to a second current source. Both current sources are biased to conduct the same bias current that in combination forms the tail current steered between the differential pair transistors. A variable capacitor and a variable resistor may be coupled between the second terminals.

Depending upon the differential input voltage applied across their gates, more of the tail current from the current sources will be steered though one of the first and second transistors in the differential pair as compared to a remaining transistor in the differential pair. This current steering through the differential pair also steers the tail current through the corresponding load resistors. Depending upon the amount of current steered through each load resistor, a corresponding ohmic voltage change is produced at the first terminals for the transistors in the differential pair. In this fashion, the current steering through the differential pair of transistors produces a differential output voltage across their first terminals.

The first terminals for the differential pair of transistors also couple to a transconductor such as a transconductor transistor. For example, a first transconductor transistor may couple to the first terminal of the first transistor. Similarly, a second transconductor transistor may couple to the first terminal of the second transistor. A high-pass filter filters the differential output voltage across the first terminals of the transistors in the differential pair to produce a high-pass filtered differential voltage. Each transconductor transistor is biased to conduct a DC bias current when the high-pass filtered differential voltage is zero (DC). At DC, a differential bias current (the difference between the current conducted through each transconductor) would also equal zero. The transconductor transistors respond to increases in high-pass filtered differential voltage by increasing the differential bias current. For example, the high-pass filter may comprise a first high-pass filter and a second high-pass filter. The first high-pass filter couples between the first terminal of the first transistor in the differential pair to a gate of the second transconductor transistor. In this fashion, the current conducted by the second transconductor transistor alternately increases from and decreases from its DC bias value in response to high-frequency changes in the differential input voltage. Similarly, the second high-pass filter couples between the first terminal of the second transistor in the differential pair and a gate of the first transconductor transistor. The current conducted through the first transconductor transistor will thus alternately increase from and decrease from its DC bias value in response to high-frequency changes in the differential input voltage.

Note that the increase in the differential bias current conducted through the transconductor transistors increases a gain of the amplifier as defined by a ratio of the differential output voltage to the differential input voltage. The transconductor transistors thus provide positive feedback in response to relatively high-frequency changes in the differential input voltage that increases a bandwidth for the amplifier. In the prior art, bandwidth and high-frequency gain were increased by reducing the load resistances for the load resistors. The positive feedback through the transconductor transistors in the disclosed amplifier is thus akin to providing adaptive load resistors that reduce their resistance during high-frequency intervals for the differential input voltage. This is quite advantage in that a wide bandwidth is obtained without the current losses that would otherwise be incurred by the conventional use of load resistors having reduced resistances across all frequencies.

In general, the differential input voltage will have varying amounts of high-frequency and lower-frequency intervals or periods depending upon the data content. For example, the data to be transmitted may be such that the differential input voltage changes states every bit period. During such times, the changes in the differential input voltage will be relatively high frequency. In contrast, the data to be transmitted may be such that the differential input voltage does not change state every bit period. The changes in the differential input voltage during such periods would be relatively low frequency. The positive feedback through the transconductor transistors during the high-frequency changes in the differential input voltage increases the amplifier gain and bandwidth without the power penalty discussed with regard to the conventional two-stage amplifier of FIG. 1. In particular, the bandwidth is increased without the die-space demand from requiring additional stages of amplification and without the excessive current demands and power consumption from the use of negative feedback to reduce the lower-frequency gain.

The differential pair of transistors may comprise a pair of NMOS transistors or a pair of PMOS transistors. In a PMOS embodiment, the first terminals for the differential pair of transistors would couple to ground through the load resistors. In contrast, in an NMOS embodiment, the first terminals couple to a power supply node through the load resistors. The following discussion is directed to an NMOS differential pair embodiment without loss of generality.

Figure 2:
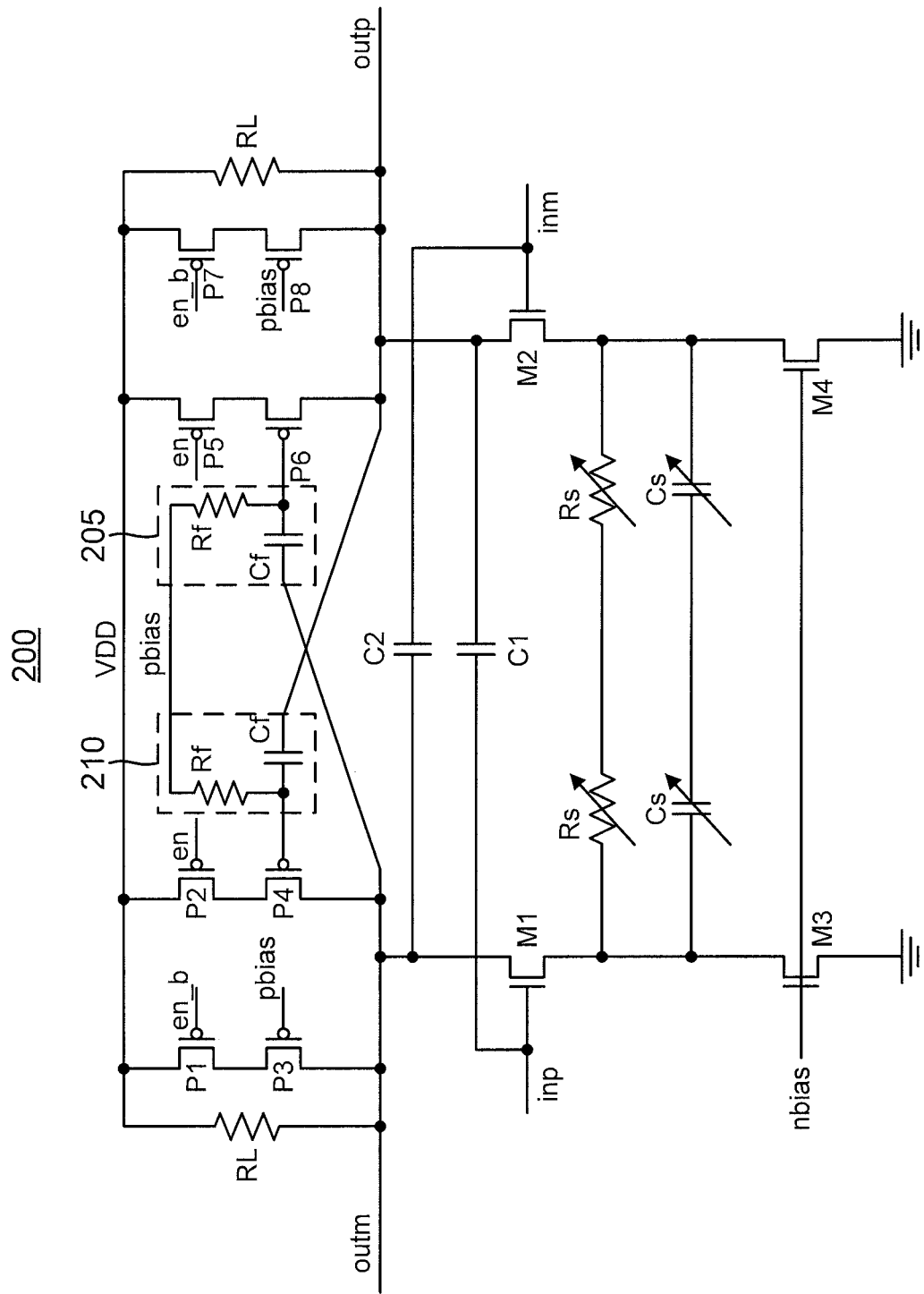
FIG. 2 is a schematic diagram of an amplifier in accordance with an embodiment of the disclosure.

An example amplifier 200 is shown in FIG. 2. NMOS transistors M1 and M2 form a differential pair of transistors that steer a tail current formed by bias currents from current source NMOS transistors M3 and M4 that have their sources coupled to ground. The source of differential pair transistor M1 couples to a drain of current source transistor M3. The source of differential pair transistor M2 couples to a drain of current source transistor M4. A bias voltage nbias drives the gates of the current source transistors M3 and M4 to establish the tail current that is steered between the differential pair transistors M1 and M2. The differential input voltage that steers the tail current comprises an input voltage inp that drives a gate of differential pair transistor M1 and a complement input voltage inm that drives a gate of differential pair transistor M2. As input voltage inp cycles higher than complement input voltage inm, more and more of the tail current established by current source transistors M3 and M4 steers through differential pair transistor M1 as compared to the remaining current steered through differential pair transistor M2. Conversely, as the complement voltage inm cycles higher than input voltage inp, more and more of the tail current steers through differential pair transistor M2 as compared to the remaining current steered through differential pair transistor M1.

This steering of the tail current produces an ohmic drop of voltage across a pair of load transistors RL coupled to the drains of the differential pair transistors M1 and M2, respectively. Each load resistor RL also couples to a power supply node providing a power supply voltage VDD. If the differential input voltage is such that all the bias current steers through differential pair transistor M1, then virtually no current flows through differential pair transistor M2. There is thus no ohmic drop of voltage across the load resistor RL coupled to the drain of differential pair transistor M2 such that a drain voltage outp of differential pair transistor M2 is charged to VDD. In contrast, a drain voltage outn for differential pair transistor M1 would then discharge towards ground depending upon the ohmic loss in the corresponding load resistor RL. To reduce the Miller effect in driving the gates of differential transistors M1 and M2, a capacitor C1 couples between the gate of differential pair transistors M1 and the drain of differential pair transistor M2. Similarly, a capacitor C2 couples between the gate of differential pair transistor M2 and the drain of differential pair transistor M1.

A corresponding transconductor transistor couples to the drain of each differential pair transistor. For example, a transconductor PMOS transistor P4 couples to the drain of differential pair transistor M1. A corresponding transconductor PMOS transistor P6 couples to the drain of differential pair transistor M2. If these transconductor transistors were absent, a high-frequency emphasis for the differential output voltages as defined by output voltages outp and outm would be produced only by an RC network coupled to the sources of differential pair transistors M1 and M2. In that regard, a pair of variable resistors Rs in the RC network couples between the sources of differential pair transistors M1 and M2. In addition, a remaining pair of variable capacitors Cs in the RC network couples between the sources of differential pair transistors M1 and M2. It will be appreciated that a single variable resistor may be used in lieu of the pair of variable resistors Rs. Similarly, a single variable capacitor may be used in lieu of the pair of variable capacitors Cs.

In one embodiment, the PMOS transconductor transistors may be deemed to comprise a means for increasing a gain responsive to the high-pass filtered differential voltage, wherein the gain is defined by a ratio of the differential output voltage to the differential input voltage.

Figure 3:
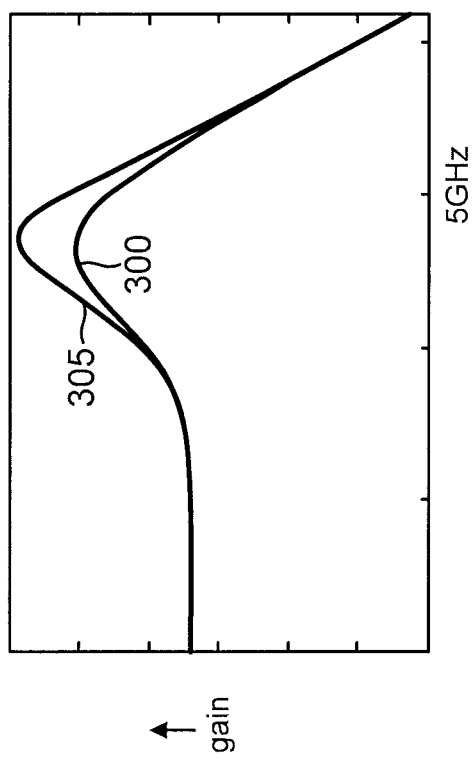
FIG. 3 is illustrates the frequency response for the amplifier of FIG. 2 with and without positive feedback.

Without the positive feedback from transconductor transistors P4 and P6, the amount of resistance from the variable resistors Rs and the amount of capacitance from variable capacitors Cs determines the high-frequency emphasis with regard to the amplification of the differential input voltage as defined by input voltages inp and inm into the differential output voltage as defined by output voltages outp and outm. FIG. 3 shows an example frequency response 300 for amplifier 200 in which transconductor transistors P4 and P6 are disabled as discussed further herein. In such a case, the high-frequency emphasis is established solely by the RC network coupled to the sources of the differential pair transistors M1 and M2. For an embodiment with the frequency response 300, the bandwidth for the data signal being amplified is approximately 5 GHz. In contrast to frequency response 300, a frequency response 305 shown in FIG. 3 corresponds to the enabling of transconductor transistors P4 and P6. As a result of this enablement, frequency response 305 has increased bandwidth and additional emphasis of the high-frequency response as compared to frequency response 300.

Figure 4:
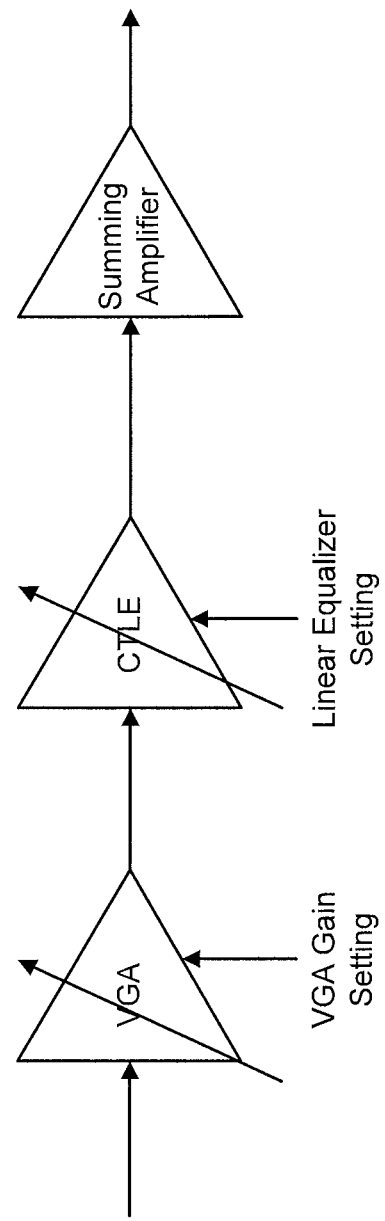
FIG. 4 illustrates a serial arrangement of three receiver amplifiers that may each incorporate the amplifier of FIG. 2.

The RC network formed by variable resistors Rs and variable capacitor Cs may be changed in alternative embodiments. For example, if the variable capacitors Cs were eliminated, the frequency response would be flat in that it would not have the high-frequency peak as shown for frequency responses 300 and 305. A serial chain of amplifiers 200 may thus be formed in which some of them include variable capacitors Rs and others would not. For example, FIG. 4 illustrates a serial chain of a variable gain amplifier (VGA), a continuous-time-linear-equalizer (CTLE) amplifier, and a summing amplifier. Each amplifier may be constructed analogously as discussed with regard to amplifier 200 of FIG. 2. In the VGA amplifier, however, the variable capacitors Cs are eliminated such that there is no peaking for the higher frequencies. A VGA gain setting for the VGA amplifier would instead control the amount of variable resistance for the variable resistors Rs. In contrast, the CTLE amplifier may include variable capacitors Cs so that a linear equalizer gain setting for the CTLE amplifier determines the amount of high-frequency peaking such as shown for frequency response 305 in FIG. 3. Finally, the summing amplifier may exclude the variable capacitors Cs and replace variable resistors Rs with a fixed resistance. There would thus be no gain setting for the summing amplifier.

In general, the type of frequency response desired for amplifier 200 depends upon a load capacitance CL (not illustrated) for whatever endpoint that is to be driven by the differential output voltage. This load capacitance in conjunction with the resistance for the load resistors RL affects a pole for the frequency response of amplifier 200. Amplifier 200 includes a pair of high-pass filters 210 and 205 that in conjunction with transconductor transistors P4 and P6 increases a value for this pole so as to extend the bandwidth of frequency response 305. In particular, high-pass filter 205 includes a capacitor Cf that couples from the drain of differential pair transistor M1 to a gate for transconductor transistor P6. High-pass filter 205 also includes a resistor Rf that couples between a node carrying a bias voltage pbias and the gate of transconductor transistor P6. In lieu of high-frequency changes in the output voltage outm, bias voltage pbias drives the gate of transconductor transistor P6 to establish its DC bias current. High-pass filter 210 is analogous to high-pass filter 205 in that high-pass filter 210 also contains a capacitor Cf that couples from the drain of differential pair transistor M2 to a gate for transconductor transistor P4. In addition, high-pass filter 210 includes a resistor Rf that couples from the pbias voltage node to the gate of transconductor transistor P4.

If the input voltage inp is sufficiently higher than the complement input voltage inm, output voltage outm will discharge toward ground whereas output voltage outp will charge towards VDD. If this specific change in the differential input voltage is a high-frequency change, high-pass filter 205 will conduct the reduced voltage for output voltage outm to the gate of transconductor transistor P6. Transconductor transistor P6 then conducts more current (as compared to whatever DC bias value is established by the bias voltage pbias), which boosts output voltage outp even higher towards VDD. In turn, this abrupt increase of the output voltage outp filters through high-pass filter 210 to turn off transconductor transistor P4 so that output voltage outm may discharge even lower towards ground. This increase in the differential bias current conducted through transconductor transistors P4 and P6 also conducts through differential pair transistors M1 and M2. This positive feedback in response to high-frequency changes in the differential input voltage increases the bandwidth and high-frequency gain for amplifier 200. This is quite advantageous in that the load resistance for load resistors RL may then be maintained at a relatively-high value to reduce power consumption. In contrast, the prior art practice of reducing the load resistance to increase bandwidth increases power consumption.

An analogous effect occurs when the complement input voltage inm is sufficiently higher than the input voltage inp. For such a change, output voltage outm will charge towards VDD whereas output voltage outp will discharge towards ground. If this change in the differential input voltage is sufficiently abrupt (high-frequency), high-pass filter 210 will pass the low voltage state for output voltage outp to the gate of transconductor transistor P4. The current through transconductor transistor P4 will then be increased as compared to its DC bias value (as established by the bias voltage pbias) to further boost output voltage outm towards VDD. High-pass filter 205 passes this abruptly higher value for output voltage outm to the gate of transconductor transistor P6, which then passes less current so that output voltage outp may discharge further towards ground. In this fashion, high-pass filters 210 and 205 in conjunction with transconductors transistors P4 and P6 provide positive feedback to boost the differential output voltage across the drains of differential pair transistors M1 and M2 in response to high-frequency changes in the differential input voltage.

If the input voltage inp is sufficiently higher than the complement input voltage inm, output voltage outm will discharge toward ground whereas output voltage outp will charge towards VDD. If this specific change in the differential input voltage is a high-frequency change, high-pass filter 205 will conduct the reduced voltage for output voltage outm to the gate of transconductor transistor P6. Transconductor transistor P6 then conducts more current (as compared to whatever DC bias value is established by the bias voltage pbias), which boosts output voltage outp even higher towards VDD. In turn, this abrupt increase of the output voltage outp filters through high-pass filter 210 to turn off transconductor transistor P4 so that output voltage outm may discharge even lower towards ground. This increase in the differential bias current conducted through transconductor transistors P4 and P6 also conducts through differential pair transistors M1 and M2. The positive feedback in response to high-frequency changes in the differential input voltage increases the bandwidth and high-frequency gain for amplifier 200. This is quite advantageous in that the load resistance for load resistors RL may then be maintained at a relatively-high value to reduce power consumption. In contrast, the prior art practice of reducing the load resistance to increase bandwidth increases power consumption.

To provide an ability to adaptively tune the amount of positive feedback and thus the boosting of higher-frequency components in the differential output voltage, transconductor transistors P4 and P6 may each comprise a corresponding plurality of transistors, each controlled by an enable signal. In particular, transconductor transistor P4 may comprise a plurality of transconductor transistors P4 that each couples through a corresponding switch such as a corresponding transistor P2 to the power supply node. Each transistor P2 is controlled by an enable signal en that determines whether the corresponding transconductor transistor P4 will contribute to any positive feedback. Similarly, each transconductor transistor P6 may comprise a plurality of transconductor transistors P6 that each couples through a corresponding switch such as a corresponding transistor P5 to the power supply node. The enable signal en controls whether the corresponding transconductor transistor P6 will contribute to any positive feedback.

Figure 5:
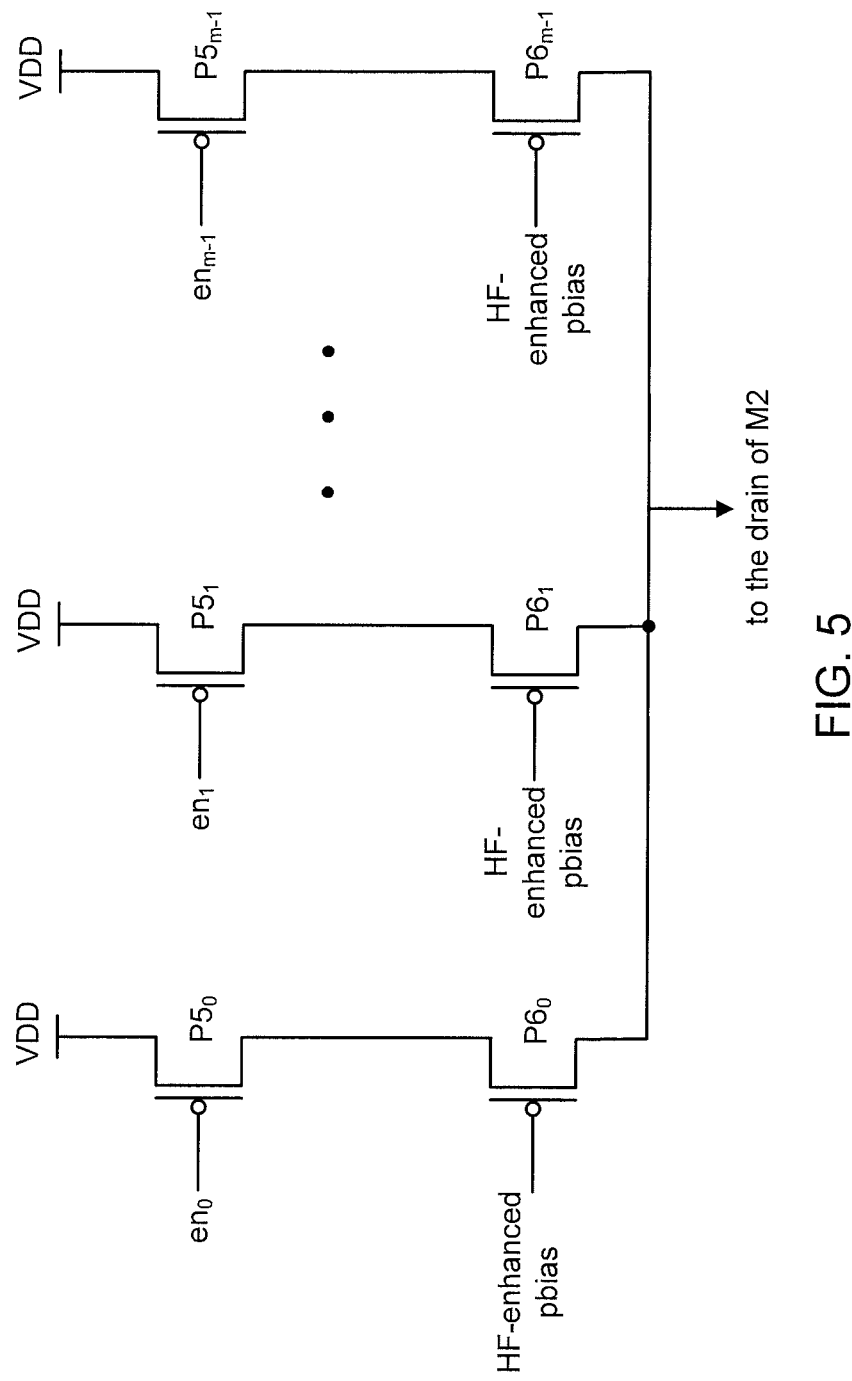
FIG. 5 shows the plural instantiation of a transconductor transistor and a corresponding enabling transistor in the amplifier of FIG. 2

An example embodiment for plural transistors P5 and P6 is shown in FIG. 5. There are m transistors P5, ranging from a zeroth transistor $P5_0$ to an (m−1)th transistor $P5_{m-1}$, where m is a positive plural integer. Each P5 transistor has its source coupled to the power supply node for supplying the power supply voltage VDD. In addition, there are m corresponding transconductor transistors P6, ranging from a zeroth transistor $P6_0$ to an (m−1)th transistor $P6_{m-1}$. The source for each transconductor transistor P6 couples to the drain of the corresponding transistor P5. An m-bit wide enable word en<0:m−1> drives the gates of the P5 transistors. In particular, an enable bit en<0> drives the gate of the $P5_0$ transistor, an enable bit en<1> drives the gate of the $P5_1$ transistor, and so on such that an enable bit en<m−1> drives the gate of the $P5_{m-1}$ transistor. The enable bits are asserted by being brought low so that the corresponding P5 transistor conducts. A P6 transistor can then provide positive feedback as discussed above if its corresponding P5 transistor is enabled to be conducting. The P4 and P2 transistors are arranged analogously.

To keep the DC bias for the output nodes unchanged regardless of the number of asserted enable bits, a plurality of PMOS transconductor transistors (P8) corresponds to the plurality of P6 transconductor transistors. Similarly, a plurality of PMOS transconductor transistors (P3) corresponds to the plurality of P4 transconductor transistors. The gates of the P3 and P8 transconductor transistors are biased by the bias voltage pbias. The gates of the P4 and P6 transconductor transistors are biased by the HF-enhanced version of pbias as produced by high pass filters 205 and 210 of FIG. 2. The bias voltage pbias thus determines the DC bias for the output nodes. The source for each P8 transistor couples to the drain of a corresponding PMOS transistor (P7) that has its source tied to the power supply node. Analogous to the arrangement of the P8 and P7 transistors, the source of each P3 transistor couples to the drain of the corresponding PMOS transistor (P1) that has its source coupled to the power supply node. A complementary enable word en_b<0:m−1> drives the gates of the P1 and P7 transistors. Specifically, a zeroth enable bit en_b<0> drives the gates of a zeroth P1 transistor and a zeroth P7 transistor. Similarly, a first enable bit en_b<1> drive the gates of a first P1 transistor and a first P7 transistor, and so on such that a final enable bit en_b<m−1> drives the gates of a final (m−1)th P1 transistor and a final (m−1)th P7 transistor.

The complementary nature of the enable bits and the complement enable bits may be better appreciated with regard to the following example embodiment in which the number m for each of the P1, P2, P3, P4, P5, P6, P7, and P8 transistors equals eight. For example, suppose that the enable bits were such that six of the P2 and the P5 transistors are conducting. The corresponding six P4 transconductor transistors and the corresponding six P6 transconductor transistors will thus provide positive feedback as discussed above with regard to amplifier 200. In such a case, there would then be two of the P7 transistors and two of the P1 transistors that would have their en_b bits asserted low so that they would be conducting. The corresponding two P3 transconductor transistors and the corresponding two P8 transconductor transistors would then conduct according to the bias voltage pbias. More generally, if i of the enable bits are asserted, then m−i of the complement enable bits would be asserted, where i is an integer greater than or equal to zero and less than or equal to m.

By varying the number of the P4 and P6 transconductor transistors that are enabled to provide positive feedback, the effect on the resulting natural frequency and thus the bandwidth extension for amplifier 200 may be varied accordingly. In addition, the degree of high-frequency emphasis for frequency response 305 of FIG. 3 may also be varied accordingly. Referring again to FIG. 4, the number of enabled P4 and P6 transconductor transistors is part of the gain settings for the VGA and CTLE amplifiers. In the summing amplifier, the number may be fixed such as enabling every possible P4 and P6 transconductor transistor to provide positive feedback. An example method of operation will now be discussed.

Figure 6:
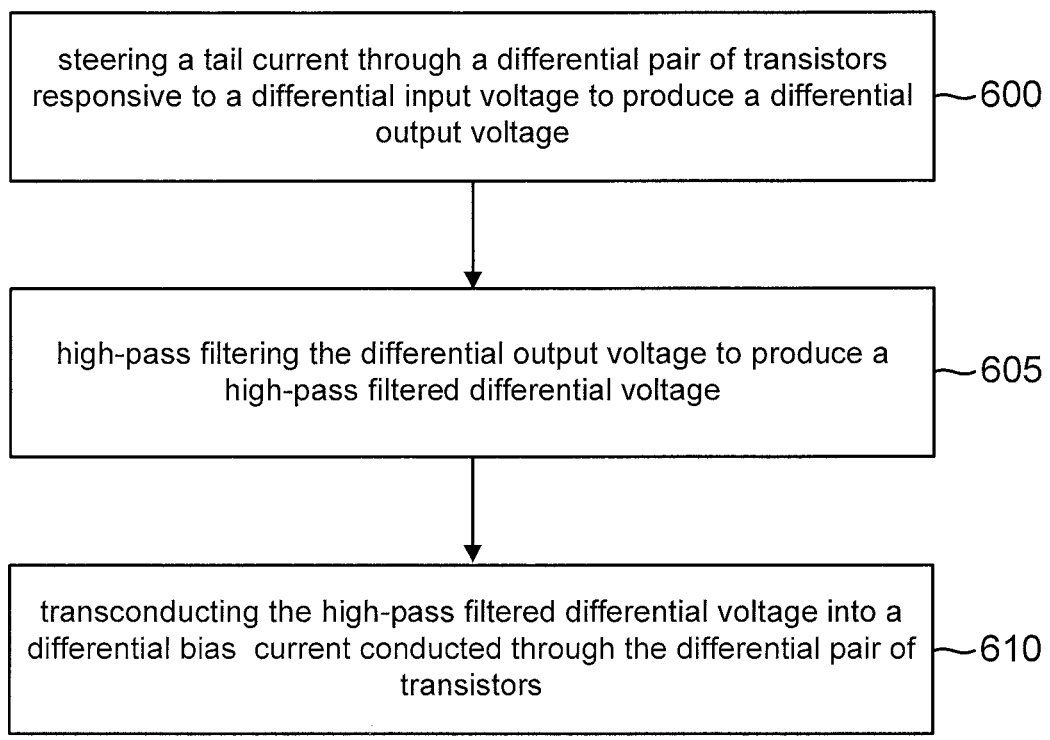
FIG. 6 is a flowchart of an example method of amplification in accordance with an embodiment of the disclosure.

A flowchart for an example method of operation for an amplifier is shown in FIG. 6. An act 600 comprises steering a tail current through a differential pair of transistors responsive to a differential input voltage to produce a differential output voltage. The steering of the bias current through the differential pair transistors M1 and M2 responsive to the differential input voltage comprising input voltages inp and outm to produce the differential output voltage comprising output voltages outp and outm is an example of act 600. An act 605 comprises high-pass filtering the differential output voltage to produce a high-pass filtered differential voltage. The difference between the gate voltages for the P4 and P6 transconductor transistors is an example of such a high-pass filtered differential voltage. Finally, an act 610 comprises transconducting the high-pass filtered differential voltage into a differential bias current conducted through the differential pair of transistors. The P6 and P4 transconductor transistors provide an example of such transconducting of the high-pass filtered differential voltage at their gates into the differential bias current driven through the differential pair of transistors M1 and M2.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A circuit, comprising:
    a differential pair of transistors including a first transistor having a first output terminal and including a second transistor having a second output terminal;
    a first load resistor coupled to the first output terminal;
    a second load resistor coupled to the second output terminal;
    a differential high-pass filter configured to filter a differential output voltage defined across the first output terminal and the second output terminal to produce a high-pass filtered differential voltage;
    a first transconductor coupled to the first output terminal; and
    a second transconductor coupled to a second output terminal, wherein the first transconductor and the second transconductor are configured to transconduct the high-pass filtered differential voltage into a differential bias current driven through the differential pair of transistors.

2. The circuit of claim 1, wherein the first transconductor comprises a first plurality of transconductor transistors coupled to the first output terminal and the second transconductor comprises a second plurality of transconductor transistors coupled to the second output terminal.

3. The circuit of claim 2, further comprising a first plurality of switches corresponding to the first plurality of transconductor transistors, wherein each transconductor transistor in the first plurality of transconductor transistors couples to a power supply node through the corresponding switch in the first plurality of switches.

4. The circuit of claim 3, wherein the first plurality of switches comprise a plurality of switching transistors having their gates controlled by an enable word.

5. The circuit of claim 4, further comprising a third plurality of transconductor transistors coupled to the first output terminal and a second plurality of switching transistors corresponding to the third plurality of transconductor transistors, wherein each transconductor transistor in the third plurality of transconductor transistors couples to the power supply node through a corresponding switching transistor in the second plurality of switching transistors, and wherein the second plurality of switching transistors are configured to have their gates controlled by a complement of the enable word.

6. The circuit of claim 1, wherein the first transistor in the differential pair includes a second terminal and the second transistor in the differential pair includes a second terminal, the circuit further comprising:
    a first current source coupled to the first transistor's second terminal; and
    a second current source coupled to the second transistor's second terminal.

7. The circuit of claim 6, wherein the first transistor and the second transistor are each NMOS transistors, and wherein the second terminals are source terminals.

8. The circuit of claim 6, further comprising:
    a variable resistor coupled between the second terminals; and
    a variable capacitor coupled between the second terminals.

9. The circuit of claim 8, wherein the variable resistor comprises a pair of variable resistors, and wherein the variable capacitor comprises a pair of variable capacitors.

10. The circuit of claim 1, wherein the first transconductor comprises a first plurality of PMOS transistors coupled to the first output terminal and the second transconductor comprises a second plurality of PMOS transistors coupled to the second output terminal.

11. The circuit of claim 10, wherein the differential high-pass filter comprises a first high-pass filter coupled between the first output terminal and the gates for the second plurality of PMOS transistors.

12. The circuit of claim 11, wherein the differential high-pass filter further comprises a second high-pass filter coupled between the second output terminal and the gates for the first plurality of PMOS transistors.

13. A method, comprising:
    driving a pair of gates for a differential pair of transistors with a differential input voltage to produce a differential output voltage across a pair of output terminals for the differential pair of transistors;
    high-pass filtering the differential output voltage to produce a high-pass filtered differential voltage; and
    transconducting the high-pass filtered differential voltage through transconductors into a differential bias current conducted through the differential pair of transistors.

14. The method of claim 13, wherein driving the pair of gates for the differential pair of transistors comprises driving a pair of gates for a differential pair of NMOS transistors.

15. The method of claim 13, further comprising:
    selecting from a plurality of transconducting transistors to provide selected transconducting transistors, wherein transconducting the high-pass filtered differential voltage through the transconductors comprises transconducting the high-pass filtered differential voltage using the selected transconducting transistors.

16. The method of claim 15, wherein selecting from the plurality of transconducting transistors comprises selecting a number of transconducting transistors sufficient to provide a desired amount of bandwidth extension, the method further comprising,
biasing the differential pair of transistors with a selected number of biasing transconductor transistors, the selected number being complementary to the number of the selected transconducting transistors.

17. The method of claim 13, further comprising adjusting a variable resistance for a variable resistor coupled to a pair of second terminals for the differential pair of transistors to adjust a gain for the differential output voltage as compared to the differential input voltage.

18. The method of claim 13, further comprising adjusting a variable capacitance for a variable resistor coupled to a pair of second terminals for the differential pair of transistors to adjust a gain for the differential output voltage as compared to the differential input voltage.

19. A circuit, comprising:
a differential pair of transistors configured to be responsive to a differential input voltage to produce a differential output voltage across a first output terminal for a first transistor in the differential pair of transistors and across a second output terminal for a second transistor in the differential pair of transistors, wherein the first transistor comprises a first NMOS transistor and the second transistor comprises a second NMOS transistor and wherein the first output terminal comprises a drain for the first NMOS transistor and the second output terminal comprises a drain for the second NMOS transistor;
a first load resistor coupled to the first output terminal;
a second load resistor coupled to the second output terminal;
a differential high-pass filter configured to filter the differential output voltage into a high-pass filtered differential voltage;
means for increasing a gain responsive to the high-pass filtered differential voltage, wherein the gain is defined by a ratio of the differential output voltage to the differential input voltage;
a first current source coupled to a source for the first NMOS transistor; and
a second current source coupled to a source for the second NMOS transistor.

20. The circuit of claim 19, wherein the first load resistor is coupled to the drain for the first NMOS transistor, and wherein a the second load resistor is coupled to the drain of the second NMOS transistor.

21. The circuit of claim 19, further comprising a variable resistor coupled between a source of the first NMOS transistor and a source for the second NMOS transistor.

22. The circuit of claim 19, further comprising a variable capacitor coupled between a source of the first NMOS transistor and a source for the second NMOS transistor.

23. A circuit comprising:
a differential pair of transistors including a first transistor and a second transistor, wherein the first transistor and the second transistor each includes a first terminal, and wherein the differential pair of transistor is configured to steer a tail current responsive to a differential input voltage;
a plurality of first transconductor transistors coupled to the first terminal of the first transistor;
a first load resistor coupled to the first terminal of the first transistor; and
a plurality of first switches corresponding to the plurality of first transconductor transistors, each first transconductor transistor being coupled in series with the corresponding first switch, and wherein each first transconductor transistor is configured to transconduct high-frequency changes in the differential input voltage into a differential bias current conducted through the differential pair of transistors when the corresponding first switch is conducting.

24. The circuit of claim 23, wherein the first transistor and the second transistor each comprises an NMOS transistor, and wherein the first terminals are drain terminals.

25. The circuit of claim 24, wherein each first switch couples between a power supply node and the corresponding first transconductor transistor.

26. The circuit of claim 23, further comprising a plurality of second transconductor transistors coupled to the first terminal of the second transistor.

27. The circuit of claim 26, further comprising:
a first high-pass filter coupled between the first terminal of the first transistor and the gates of the second transconductor transistors; and
a second high-pass filter coupled between the first terminal of the first transistor and the gates of the first transconductor transistors.

* * * * *